(12) United States Patent
Clevenger et al.

(10) Patent No.: US 9,608,156 B2
(45) Date of Patent: Mar. 28, 2017

(54) ASSEMBLY AND MOUNTING OF SOLAR CELLS ON SPACE PANELS

(71) Applicant: SolAero Technologies Corp., Albuquerque, NM (US)

(72) Inventors: Marvin B. Clevenger, Albuquerque, NM (US); Benjamin C. Richards, Albuquerque, NM (US); Cory Tourino, Edgewood, NM (US)

(73) Assignee: SolAcro Technologies Corp., Albuquerque, NM (US)

(*) Notice: Subject to any disclaimer, the term of this patent is extended or adjusted under 35 U.S.C. 154(b) by 0 days.

(21) Appl. No.: 14/795,461

(22) Filed: Jul. 9, 2015

(65) Prior Publication Data

US 2017/0012160 A1    Jan. 12, 2017

(51) Int. Cl.
| | |
|---|---|
| H01L 21/00 | (2006.01) |
| H01L 31/0725 | (2012.01) |
| H01L 31/041 | (2014.01) |
| H01L 31/0735 | (2012.01) |
| H01L 31/048 | (2014.01) |
| H01L 31/0304 | (2006.01) |
| H01L 31/074 | (2012.01) |
| H01L 31/18 | (2006.01) |
| H01L 31/049 | (2014.01) |

(52) U.S. Cl.
CPC .... *H01L 31/0725* (2013.01); *H01L 31/03046* (2013.01); *H01L 31/041* (2014.12); *H01L 31/048* (2013.01); *H01L 31/074* (2013.01); *H01L 31/0735* (2013.01); *H01L 31/18* (2013.01); *H01L 31/049* (2014.12)

(58) Field of Classification Search
CPC ............ H01L 31/0516; H01L 31/049; H01L 31/0504; H01L 31/0508; H01L 31/022425
See application file for complete search history.

(56) References Cited

U.S. PATENT DOCUMENTS

| | | | |
|---|---|---|---|
| 4,045,245 A | 8/1977 | Coleman et al. | |
| 4,235,643 A | 11/1980 | Amick | |
| 4,321,417 A | 3/1982 | Kurth et al. | |
| 5,720,452 A * | 2/1998 | Mutschler, Jr. ........ | B64G 1/222 136/245 |
| 6,034,322 A | 3/2000 | Pollard | |
| 7,095,050 B2 | 8/2006 | Wanlass et al. | |
| 7,122,398 B1 | 10/2006 | Pichler | |
| 7,671,270 B2 | 3/2010 | Fang | |

(Continued)

FOREIGN PATENT DOCUMENTS

| | | |
|---|---|---|
| JP | 2001-351418 A | 12/2001 |
| JP | 2009-164204 A | 7/2009 |

(Continued)

OTHER PUBLICATIONS

U.S. Appl. No. 14/719,111, filed May 21, 2015, Aiken et al.

(Continued)

*Primary Examiner* — Zandra Smith
*Assistant Examiner* — John M Parker

(57) ABSTRACT

The present disclosure provides a method of fabricating a solar cell panel in an automated process by applying an adhesive pattern to a support, positioning a solar cell assembly over the pattern, and applying pressure to adhere the assembly to the support.

23 Claims, 18 Drawing Sheets

(56) References Cited

U.S. PATENT DOCUMENTS

| | | |
|---|---|---|
| 8,097,484 B1 | 1/2012 | Yang et al. |
| 8,148,628 B2 | 4/2012 | Fang |
| 8,753,918 B2 | 6/2014 | Varghese et al. |
| 8,841,157 B2 | 9/2014 | Rekow |
| 8,865,505 B2 | 10/2014 | Nakahama et al. |
| 8,987,042 B2 | 3/2015 | Varghese et al. |
| 9,287,438 B1 | 3/2016 | Varghese et al. |
| 2006/0235717 A1 | 10/2006 | Sharma et al. |
| 2008/0023065 A1 | 1/2008 | Borden et al. |
| 2008/0289680 A1 | 11/2008 | MacFarlane |
| 2009/0266399 A1* | 10/2009 | Basol ................ H01L 31/0322 136/244 |
| 2009/0301543 A1 | 12/2009 | Reddy et al. |
| 2010/0012172 A1 | 1/2010 | Meakin et al. |
| 2010/0012175 A1 | 1/2010 | Varghese et al. |
| 2010/0018565 A1 | 1/2010 | Funakoshi |
| 2010/0089435 A1 | 4/2010 | Lockenhoff |
| 2010/0116310 A1 | 5/2010 | Shimizu et al. |
| 2010/0186804 A1 | 7/2010 | Cornfeld |
| 2010/0282288 A1 | 11/2010 | Cornfeld |
| 2010/0288331 A1 | 11/2010 | Weibezahn |
| 2011/0073185 A1 | 3/2011 | Nishimiya et al. |
| 2011/0083716 A1* | 4/2011 | Meakin ................ H01L 31/048 136/244 |
| 2011/0232745 A1* | 9/2011 | Alves ..................... C01B 33/12 136/256 |
| 2012/0060895 A1 | 3/2012 | Rubin et al. |
| 2012/0186629 A1 | 7/2012 | Nowlan |
| 2012/0211047 A1 | 8/2012 | Cornfeld |
| 2012/0216860 A1* | 8/2012 | Sainoo ................ H01L 31/0516 136/256 |
| 2012/0222717 A1* | 9/2012 | Chandrasekaran ........................ H01L 31/035281 136/244 |
| 2012/0305081 A1 | 12/2012 | Mizuno et al. |
| 2013/0014802 A1* | 1/2013 | Zimmerman ... H01L 31/022425 136/244 |
| 2013/0298963 A1 | 11/2013 | Greiff et al. |
| 2014/0318602 A1 | 10/2014 | Black |
| 2015/0162485 A1 | 6/2015 | Varghese et al. |
| 2015/0280044 A1 | 10/2015 | Derkacs et al. |
| 2015/0287865 A1 | 10/2015 | Aiken et al. |
| 2015/0364631 A1* | 12/2015 | Aiken ................ H01L 31/0504 136/251 |
| 2016/0359079 A1* | 12/2016 | Clevenger ............. H01L 31/049 |

FOREIGN PATENT DOCUMENTS

| | | |
|---|---|---|
| JP | 2010-157652 A | 7/2010 |
| JP | 2010-287378 A | 12/2010 |
| JP | 2012-119343 A | 6/2012 |
| JP | 2013-115233 A | 6/2013 |
| JP | 2015-065276 A | 4/2015 |
| WO | WO 2010/113880 A1 | 10/2010 |

OTHER PUBLICATIONS

U.S. Appl. No. 14/729,412, filed Jun. 3, 2015, Tourino et al.
U.S. Appl. No. 14/729,422, filed Jun. 3, 2015, Tourino et al.
Search Report and Written Opinion dated Mar. 21, 2016 for Belgian patent application No. BE2015/5494, 11 pgs.
Search Report and Written Opinion dated Mar. 30, 2016 for Belgian patent application No. BE2015/5499, 14 pgs.
Search Report and Opinion dated May 27, 2016 for European patent application No. 15176553.4, 5 pgs.
Search Report and Opinion dated May 27, 2016 for European patent application No. 16150567.2, 7 pgs.

* cited by examiner

ASSEMBLY AND MOUNTING OF SOLAR CELLS ON SPACE PANELS

REFERENCE TO RELATED APPLICATIONS

The present application is related to U.S. patent application Ser. Nos. 14/592,519, filed Jan. 8, 2015, and Ser. No. 14/719,111, filed May 21, 2015, both of which are herein incorporated by reference in their entireties.

BACKGROUND OF THE DISCLOSURE

1. Field of the Disclosure

The present disclosure relates to the field of photovoltaic solar arrays, and more particularly to fabrication processes utilizing, for example, multijunction solar cells based on III-V semiconductor compounds fabricated into interconnected Cell-Interconnect-Cover Glass (CIC) assemblies and mounted on a support or substrate using automated processes.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Space applications frequently use high efficiency solar cells, including multijunction solar cells based on III/V compound semiconductors. Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Conventional space solar array panels at present are most often comprised of a relatively densely packed arrangement of large solar cells formed from group III-V compound semiconductor devices mounted on a rigid supporting panel and operating without lenses for optical concentration of sunlight. A conventional space solar array panel may include a support, space solar cells disposed on the support, interconnection components for connecting the solar cells, and bypass diodes also connected to the solar cells.

Solar panels are generally formed by combining a large number of solar cells in an array. Individual solar cells, frequently with a rectangular or generally square-shape and sometimes with cropped corners, are connected in series to form a string of solar cells, whereby the number of solar cells used in the string determines the output voltage. Solar cells or strings of solar cells can also be interconnected in parallel, so as to increase the output current. In the field of space applications, individual solar cells are provided with interconnects and cover glass so as to form so-called CICs (Cell-Interconnect-Cover Glass) assemblies, which are then combined to form an array. Conventionally, these large solar cells have been mounted on a support and interconnected using a substantial amount of manual labor. For example, first individual CICs are produced with each interconnect individually welded to each cell, and each cover glass individually mounted. Then, these CICs are connected in series to form strings, generally in a substantially manual manner, including welding or soldering steps. Then, these strings are applied to a panel or substrate and interconnected, in a process that includes the application of adhesive, wiring, and other assembly steps.

Close packing of the large solar cells on the space solar array panel is challenging due to requirement for interconnection of the solar cells to form a series circuit and to implement and interconnect the bypass diodes. An additional challenge can sometimes reside in the need to interconnect a plurality of strings of series connected solar cells in parallel. All of this has traditionally been carried out in a manual and substantially labor-intensive manner.

There is a continuing need for improved methods of manufacturing and assembling photovoltaic solar arrays that can result in decreases in cost and/or increases in performance.

SUMMARY OF THE INVENTION

1. Objects of the Disclosure

It is an object of the present disclosure to provide an automated process for producing solar cell panels for space applications.

It is another object of the present disclosure to provide an automated assembly tool for producing solar cell panels for space applications.

It is an object of the disclosure to provide a supply cassette including a plurality of solar cell assemblies connected in series and that can be used in an automated process to form a solar array panel by automatically placing and adhering said solar cell assemblies to the support.

It is another object of the disclosure to provide a method for making a solar cell panel.

It is another object of the disclosure to provide for an assembly structure and method that facilitates automation of at least certain steps of the process for manufacture of solar cell assemblies or CICs and panels of interconnected CICs.

Some implementations of the present disclosure may incorporate or implement fewer of the aspects and features noted in the foregoing objects.

2. Features of the Disclosure

Briefly, and in general terms, the present disclosure provides a method of fabricating a solar cell panel in an automated process by applying an adhesive pattern to a support, positioning a solar cell assembly over the pattern, and applying pressure to adhere the assembly to the support.

In one embodiment, the present disclosure provides method of fabricating a solar cell array carrier comprising: providing a support for mounting an array of solar cells; providing a pattern of discrete predefined adhesive regions on the top surface of the support; positioning a single solar cell assembly over the top surface of the adhesive region; and bonding the solar cell assembly to the region by application of pressure. In certain embodiments, the method includes one or more automated steps.

In another embodiment, the present disclosure provides a method of fabricating a solar cell array carrier comprising: providing an aluminum honeycomb support with a carbon composite face sheet; providing a double sided adhesive film and positioning it on the top surface of the face sheet; bonding the bottom surface of the adhesive film to the top surface of the face sheet by co-curing; sequentially positioning a sequence of solar cell assemblies over the top surface of the adhesive film; and sequentially bonding each of the sequence of solar cell assemblies to a predefined region on the top surface of the face sheet. In certain embodiments, the method includes one or more automated steps.

In some embodiments, a plurality of solar cells are disposed closely adjacent to one another on each of the strips by a distance between 5 and 25 microns.

In some embodiments, each of the solar cells have a dimension in the range of 0.5 to 10 mm on a side.

In some embodiments of the disclosure, the support is a KAPTON® layer, that is, a polymide film layer. KAPTON® is a trademark of E.I. du Pont de Nemours and Company. The chemical name for KAPTON® is poly(4,4'-oxydiphenylene-pyromellitimide). Other polymide film sheets or layers may also be used.

In some embodiments, the support has a thickness of between 25 and 100 microns, or between 1 mil (25.4 µm) and 4 mil (101.6 µm).

In some embodiments, the metal layer is attached to the support layer in an adhesive-less manner, to limit outgassing when used in a space environment.

In some embodiments, a double-faced pressure-sensitive adhesive template or patch is positioned on the backside of the solar cell assembly.

In some embodiments the support is mounted on a metallic honeycomb structure.

In some embodiments, the double-faced pressure-sensitive adhesive template or patch is shaped so that the shape matches and is congruent to that of the peripheral outline of the solar cell assembly.

In some embodiments, the double-faced pressure-sensitive adhesive template or patch and the polyimide film are bonded together by a co-curing process.

In some embodiments, the double-faced pressure-sensitive adhesive template or patch is covered at least partially with a release liner which is removed before making the bonding with the substrate.

In some embodiments, the release liner is at least partially patterned so that it matches the shape of the double-faced pressure-sensitive adhesive template or patch.

In some embodiments the solar cell device and a substrate are automatically bonded together with at least one double-faced pressure adhesive patch, where the at least one double-faced pressure adhesive patch is at least partially positioned on backside of the solar cell device, in particular the interior of the solar cell device and/or at least partially positioned on the substrate to be before making the bonding connection.

In some embodiments the at least one double-faced pressure sensitive adhesive patch is applied to the substrate, in particular a polymer film, more particular a polyimide film, the shape of the at least one double-faced pressure sensitive adhesive patch patterned to match the shape of the at least one solar cell device.

In some embodiments, the solar cell device is automatically positioned on the substrate so that its shape essentially matches the shape of at least one double-faced pressure sensitive adhesive patch.

In some embodiments, after making the bonding connection at least two solar cell devices (10) are automatically interconnected using a pick and place process for positioning the interconnectors, followed by automatic parallel gap welding.

In some embodiments the at least two solar cell devices are automatically electrically connected, in particular wire bonded together, the at least two solar cell devices having co-planar front-side electrical contacts.

In some embodiments, a single-layer pressure sensitive adhesive (PSA) film is used as a bonding adhesive to attach solar cells or solar cell assemblies to a solar panel.

In some embodiments, the PSA film may be a patterned or a continuous layer.

In some embodiments, the PSA film may be an acrylic or a silicone adhesive, or any other suitable material.

In some embodiments, the PSA film may have one or two release liners, or possibly no release liners.

In some embodiments, the substrate may be a rigid substrate, such as an aluminum honeycomb substrate with carbon composite face sheet, or it may be a flexible substrate, such as a polyimide film.

In some embodiments, the PSA film may also be applied to the back of the solar cells or solar cell assemblies.

In some embodiments, a pressure sensitive adhesive (PSA) film is prepared as a single layer.

In some embodiments, the PSA film may be prepared onto a permanent flexible substrate, such as a polyimide, with a release liner or liners on the opposite side.

In some embodiments, there may be a multiplicity of individual PSA patterns, each with its own front and back release liners. In some embodiments, there may be a multiplicity of individual PSA patterns, with one single, continuous release liner on one side and a multiplicity of release liners on the opposite side.

In some embodiments, there may be a multiplicity of individual PSA patterns with two continuous release layers covering the multiplicity of patterns on both sides.

In some embodiments, there may be a single, continuous film of PSA with release liners on one or both sides.

In some embodiments, the PSA film is used to bond solar cells or solar cell assemblies to a substrate.

In some embodiments, the PSA film may be applied first to the substrate, and then the solar cells attached to the PSA film, or it may be applied first to the back of the solar cells, and then the solar cells with PSA film are applied to the substrate.

In some embodiments, if the PSA film is prepared on a permanent substrate, the solar cells or solar cell assemblies may be applied directly to the PSA film.

In some embodiments, the PSA film may have continuous release liners that are removed in one step, or it may have a multiplicity of release liners that are removed individually.

In some embodiments, the PSA may be a silicone adhesive, an acrylic adhesive, or any other material that may be suitable for a PSA.

In some embodiments, the PSA may be a patterned layer, or it may be a continuous layer. For instance, the PSA may be patterned into the shape of solar cells.

In some embodiments, the assembly of polyimide-PSA-release liner is bonded directly to a solar panel substrate by co-curing the polyimide film to the face of the solar panel substrate. The solar panel substrate to which the polyimide is bonded may be an aluminum honeycomb substrate, and it may have a carbon composite or aluminum face sheet. It may be a rigid substrate, or it may be a flexible substrate.

In some embodiments, following the above described assembly, the substrate is ready to have the solar cells or solar cell assemblies bonded to it. The release liner is removed when it is time to bond the solar cells, which exposes the PSA, and the solar cells are bonded to the PSA and the substrate. Since the PSA thickness is precisely controlled during manufacturing, the bondline is uniform and there is less opportunity to entrap air than when a liquid adhesive is used.

In another aspect, the present disclosure provides a space vehicle and its method of fabrication comprising: a payload disposed on or within the space vehicle; and a power source for the payload, including an array of solar cell assemblies mounted on a panel, each solar cell assembly being of the type described above.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWING

To complete the description and in order to provide for a better understanding of the disclosure, a set of drawings is provided. Said drawings form an integral part of the description and illustrate embodiments of the disclosure, which should not be interpreted as restricting the scope of the disclosure, but just as examples of how the disclosure can be carried out. The drawings comprise the following figures.

DESCRIPTION OF ILLUSTRATIVE EMBODIMENTS

Figure 1A:
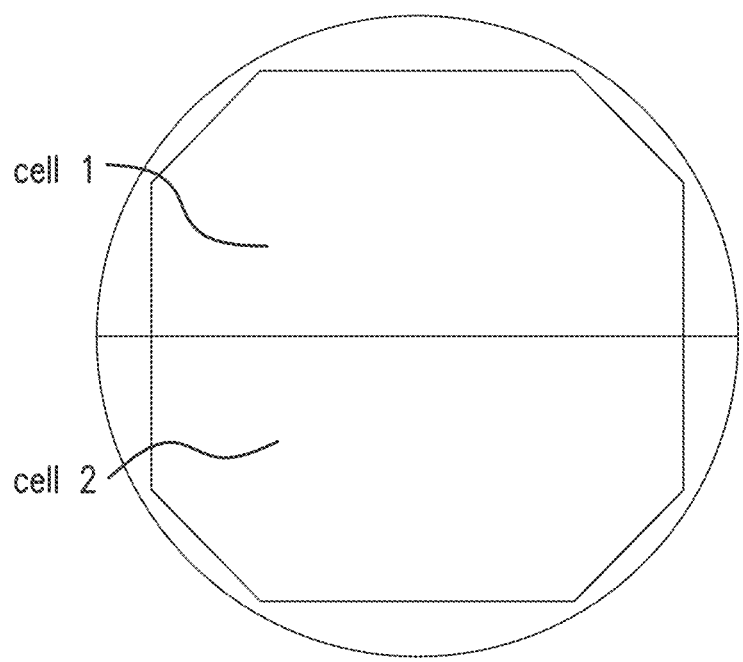
FIG. 1A is a top plan view of a wafer with two solar cells being implemented.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells are disclosed in the related applications noted above. Some, many or all of such features may be included in the structures and processes associated with the solar cells of the present disclosure. However, more particularly, the present disclosure is directed to several embodiments of the interconnect element.

More generally, however, the present disclosure may be adapted to multijunction solar cells as disclosed in related applications that may include three, four, five, or six subcells, with band gaps in the range of 1.8 to 2.2 eV (or higher) for the top subcell; 1.3 to 1.8 eV and 0.9 to 1.2 eV for the middle subcells; and 0.6 to 0.8 eV for the bottom subcell, respectively.

The present disclosure provides a process for the design and fabrication of a covered-interconnect-cell or "CIC" using multijunction solar cells that improve manufacturing efficiency and/or performance. More specifically, the present disclosure intends to provide a relatively simple and reproducible technique that is suitable for use in a high volume production environment in which various semiconductor layers are deposited in an MOCVD reactor, and subsequent processing steps are defined and selected to minimize any physical damage to solar cell and the quality of the deposited layers, thereby ensuring a relatively high yield of operable solar cells meeting specifications at the conclusion of the fabrication processes.

FIG. 1A is a top plan view of a wafer with two solar cells (cell 1 and cell 2) being implemented.

Figure 1B:
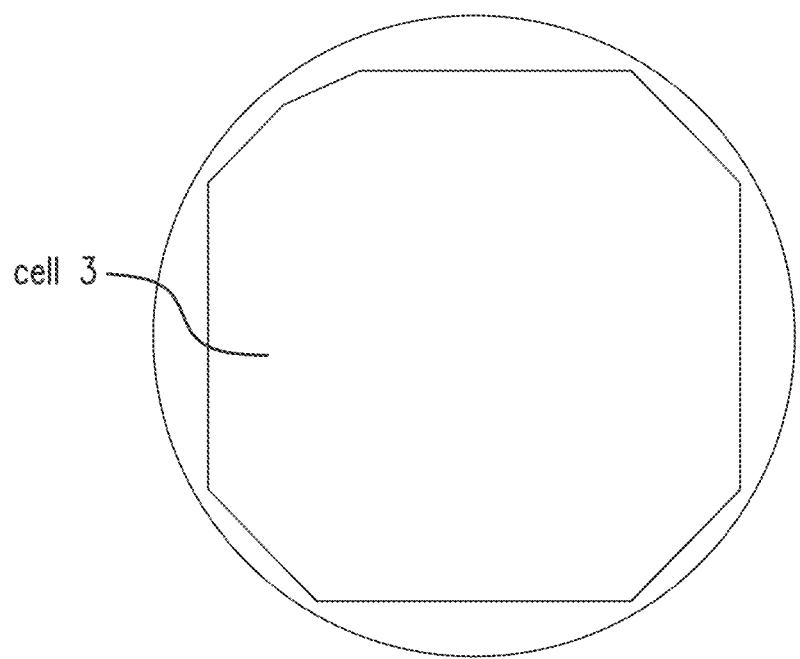
FIG. 1B is a top plan view of a wafer with a single solar cell being implemented.

FIG. 1B is a top plan view of a wafer with a single solar cell (cell 3) being implemented.

Figure 2A:
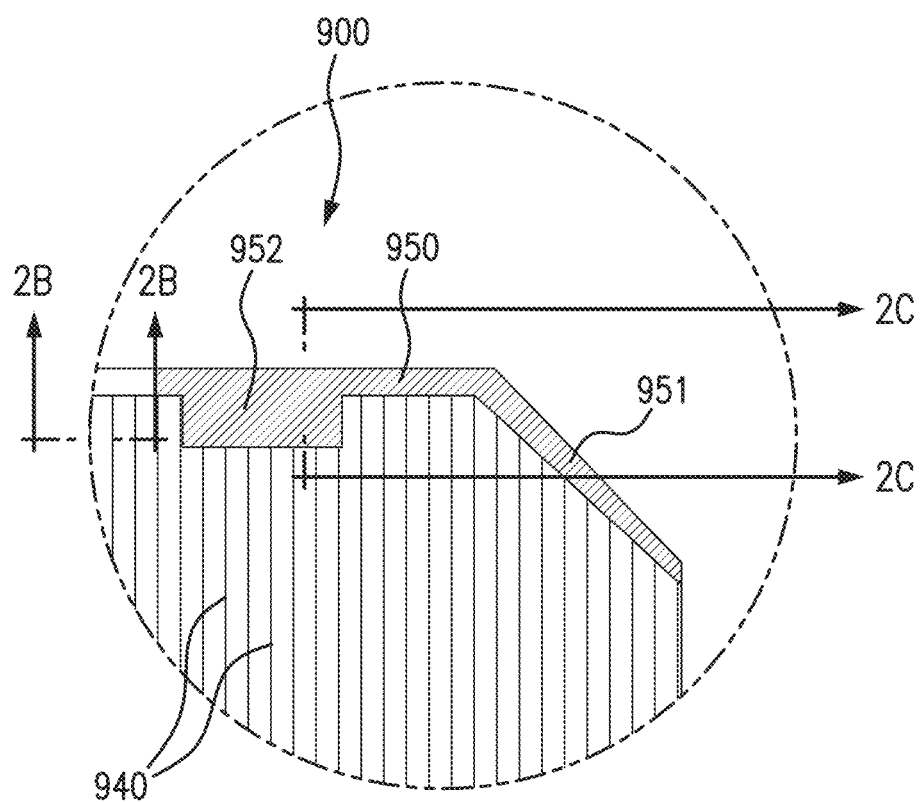
FIG. 2A is a top plan view of a portion of a solar cell according to the present disclosure.

FIG. 2A is a top plan view of a portion of a solar cell 900 according to the present disclosure depicting metal grid layers 940 and metal contact pad 952 adjacent peripheral edge regions 950 and 951 of solar cell 900.

Figure 2B:
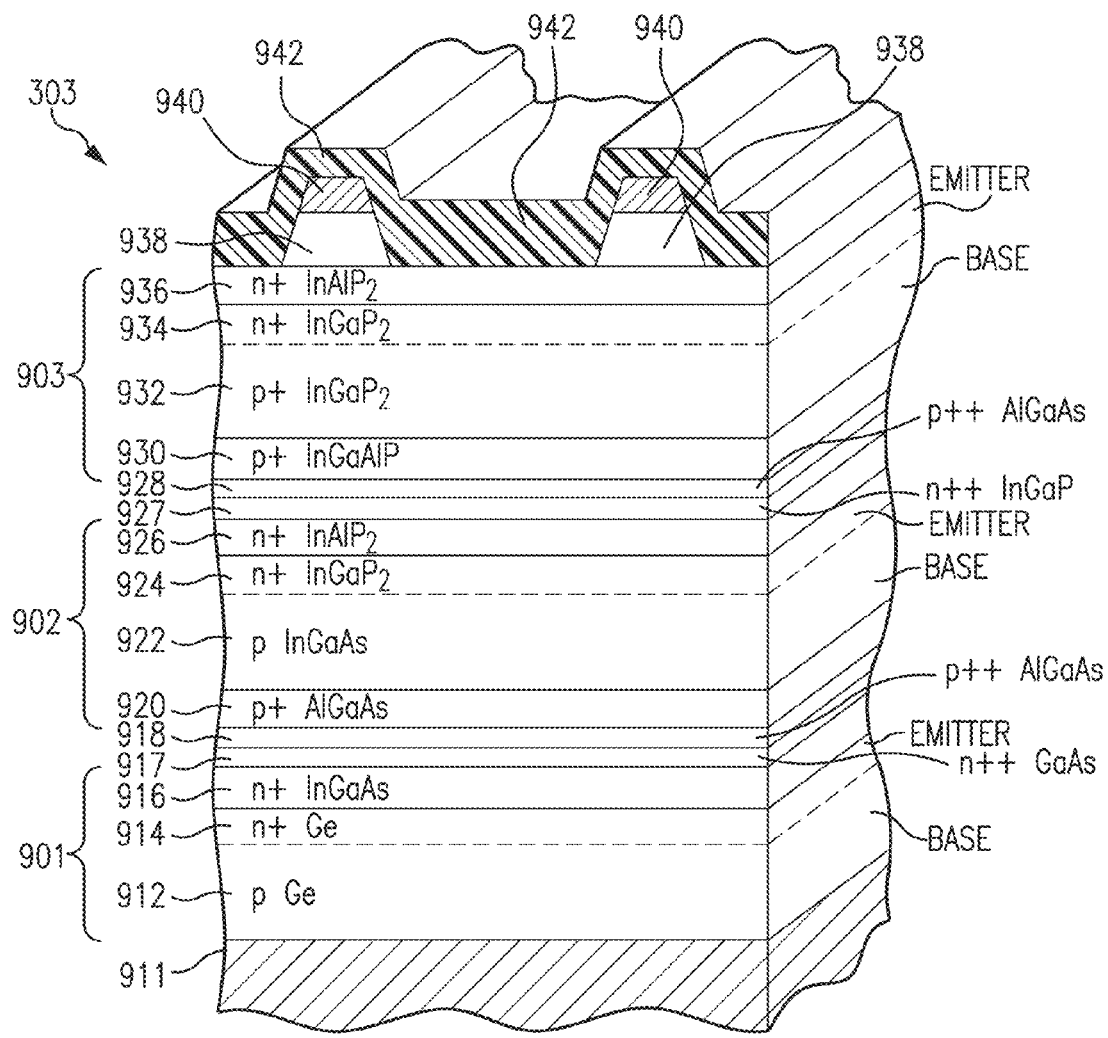
FIG. 2B is a cross-sectional view of a multijunction solar cell through the 2B-2B plane of the solar cell of FIG. 2A.

FIG. 2B is a cross-sectional view of a multijunction solar cell through the 2B-2B plane of the solar cell of FIG. 2A which may be used as an example in which the processes as provided by the present disclosure may be implemented. In FIG. 2B, each dashed line indicates the active region junction between a base layer and emitter layer of a subcell.

As shown in the illustrated example of FIG. 2B, the bottom subcell 901 includes a substrate 912 formed of p-type germanium ("Ge") which also serves as a base layer. A contact pad 911 can be formed on the bottom of base layer 912 to provide electrical contact to the multijunction solar cell 303. The bottom subcell 901 further includes, for example, a highly doped n-type Ge emitter layer 914, and an n-type indium gallium arsenide ("InGaAs") nucleation layer 916. The nucleation layer is deposited over the base layer 912, and the emitter layer is formed in the substrate by diffusion of deposits into the Ge substrate, thereby forming the n-type Ge layer 914. Heavily doped p-type aluminum gallium arsenide ("AlGaAs") and heavily doped n-type gallium arsenide ("GaAs") tunneling junction layers 918, 917 may be deposited over the nucleation layer 916 to provide a low resistance pathway between the bottom and middle subcells.

In the illustrated example of FIG. 2B, the middle subcell 902 includes a highly doped p-type aluminum gallium arsenide ("AlGaAs") back surface field ("BSF") layer 920, a p-type InGaAs base layer 922, a highly doped n-type indium gallium phosphide ("InGaP$_2$") emitter layer 924 and a highly doped n-type indium aluminum phosphide ("AlInP$_2$") window layer 926. The InGaAs base layer 922 of the middle subcell 902 can include, for example, approximately 1.5% In. Other compositions may be used as well. The base layer 922 is formed over the BSF layer 920 after the BSF layer is deposited over the tunneling junction layers 918 of the bottom subcell 901.

The BSF layer 920 is provided to reduce the recombination loss in the middle subcell 902. The BSF layer 920 drives minority carriers from a highly doped region near the back surface to minimize the effect of recombination loss. Thus, the BSF layer 920 reduces recombination loss at the backside of the solar cell and thereby reduces recombination at the base layer/BSF layer interface. The window layer 926 is deposited on the emitter layer 924 of the middle subcell 902. The window layer 926 in the middle subcell 902 also helps reduce the recombination loss and improves passivation of the cell surface of the underlying junctions. Before depositing the layers of the top cell 903, heavily doped n-type InGaP and p-type AlGaAs tunneling junction layers 927, 928 may be deposited over the middle subcell 902.

In the illustrated example, the top subcell 909 includes a highly doped p-type indium gallium aluminum phosphide ("InGaAlP") BSF layer 930, a p-type InGaP$_2$ base layer 932, a highly doped n-type InGaP$_2$ emitter layer 934 and a highly doped n-type InAlP$_2$ window layer 936. The base layer 932 of the top subcell 903 is deposited over the BSF layer 930 after the BSF layer 930 is formed over the tunneling junction layers 928 of the middle subcell 902. The window layer 936 is deposited over the emitter layer 934 of the top subcell after the emitter layer 934 is formed over the base layer 932. A cap or contact layer 938 may be deposited and patterned into separate contact regions over the window layer 936 of the top subcell 903. The cap or contact layer 938 serves as an electrical contact from the top subcell 903 to metal grid layer 940. The doped cap or contact layer 938 can be a semiconductor layer such as, for example, a GaAs or InGaAs layer.

After the cap or contact layer 938 is deposited, the grid lines 940 are formed. The grid lines 940 are deposited via evaporation and lithographically patterned and deposited over the cap or contact layer 938. The mask is subsequently lifted off to form the finished metal grid lines 940 as depicted in FIG. 2B, and the portion of the cap layer that has not been metallized is removed, exposing the surface of the window layer 936.

Figure 2C:
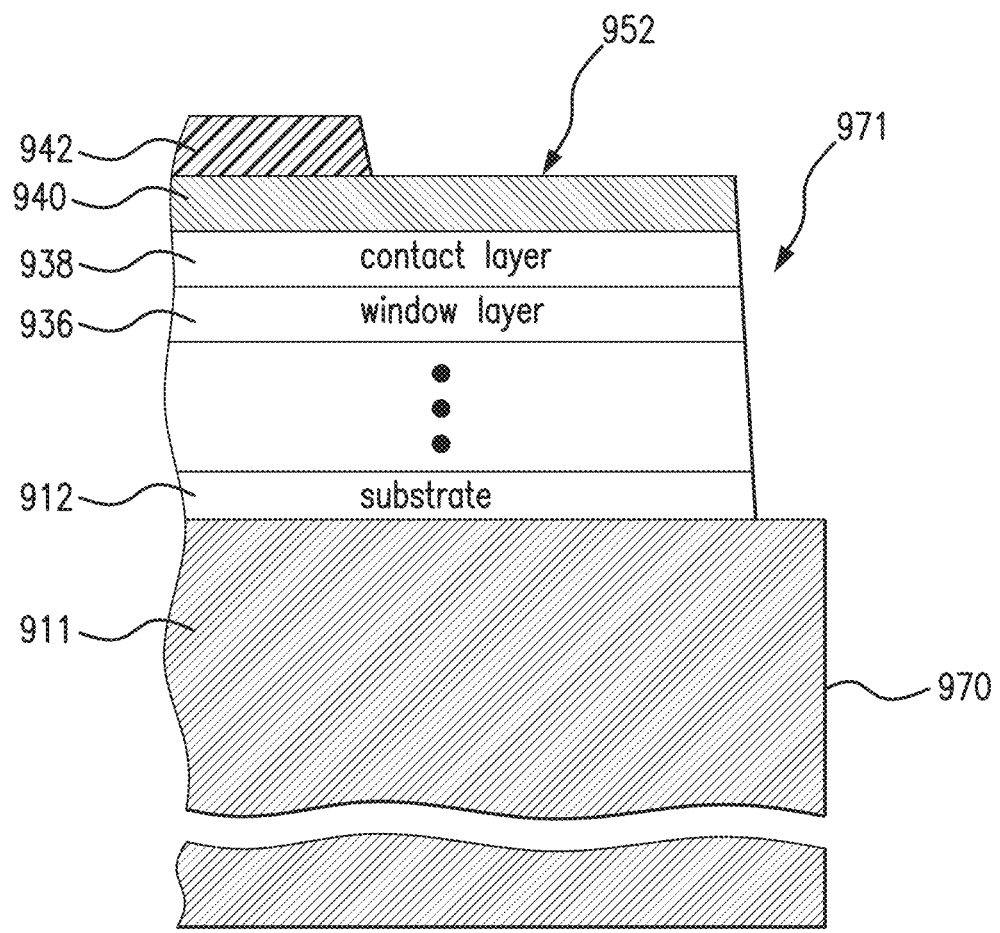
FIG. 2C is a cross-sectional view of the solar cell of FIG. 2A through the 2C-2C plane shown in FIG. 2A.

In some embodiments, a trench or channel 971 shown in FIG. 2C, or portion of the semiconductor structure, is also etched around each of the solar cells. These channels 971 define a peripheral boundary between the solar cell (later to be scribed from the wafer) and the rest of the wafer, and leaves a mesa structure (or a plurality of mesas, in the case of more than one solar cell per wafer) which define and constitute the solar cells later to be scribed and diced from the wafer.

As more fully described in U.S. Patent Application Publication No. 2010/0012175 A1 (Varghese et al.), hereby incorporated by reference in its entirety, the grid lines 940 are preferably composed of Ti/Au/Ag/Au, although other suitable materials may be used as well.

During the formation of the metal contact layer 940 deposited over the p+ semiconductor contact layer 938, and during subsequent processing steps, the semiconductor body and its associated metal layers and bonded structures will go through various heating and cooling processes, which may put stress on the surface of the semiconductor body. Accordingly, it is desirable to closely match the coefficient of thermal expansion of the associated layers or structures to that of the semiconductor body, while still maintaining appropriate electrical conductivity and structural properties of the layers or structures. Thus, in some embodiments, the metal contact layer 940 is selected to have a coefficient of thermal expansion (CTE) substantially similar to that of the adjacent semiconductor material. In relative terms, the CTE may be within a range of 0 to 15 ppm per degree Kelvin different from that of the adjacent semiconductor material. In the case of the specific semiconductor materials described above, in absolute terms, a suitable coefficient of thermal expansion of layer 940 would range from 5 to 7 ppm per degree Kelvin. A variety of metallic compositions and multilayer structures including the element molybdenum would satisfy such criteria. In some embodiments, the layer 940 would preferably include the sequence of metal layers Ti/Au/Mo/Ag/Au, Ti/Au/Mo/Ag, or Ti/Mo/Ag, where the thickness ratios of each layer in the sequence are adjusted to minimize the CTE mismatch to GaAs. Other suitable sequences and material compositions may be used in lieu of those disclosed above.

In some embodiments, the metal contact scheme chosen is one that has a planar interface with the semiconductor, after heat treatment to activate the ohmic contact. This is done so that (i) a dielectric layer separating the metal from the semiconductor doesn't have to be deposited and selectively etched in the metal contact areas; and (ii) the contact layer is specularly reflective over the wavelength range of interest.

The grid lines are used as a mask to etch down the surface to the window layer 936 using a citric acid/peroxide etching mixture.

An antireflective (ARC) dielectric coating layer 942 is applied over the entire surface of the "top" side of the wafer with the grid lines 940.

FIG. 2C is a highly simplified cross-sectional view of the solar cell of FIG. 2A similar to that of FIG. 2B, but in a view longitudinally along a grid line. The cross-sectional view of the solar cell of FIG. 2A is through the 2C-2C plane. A contact pad 952 electrically connected to the grid line metal 940 is depicted.

Figure 2D:
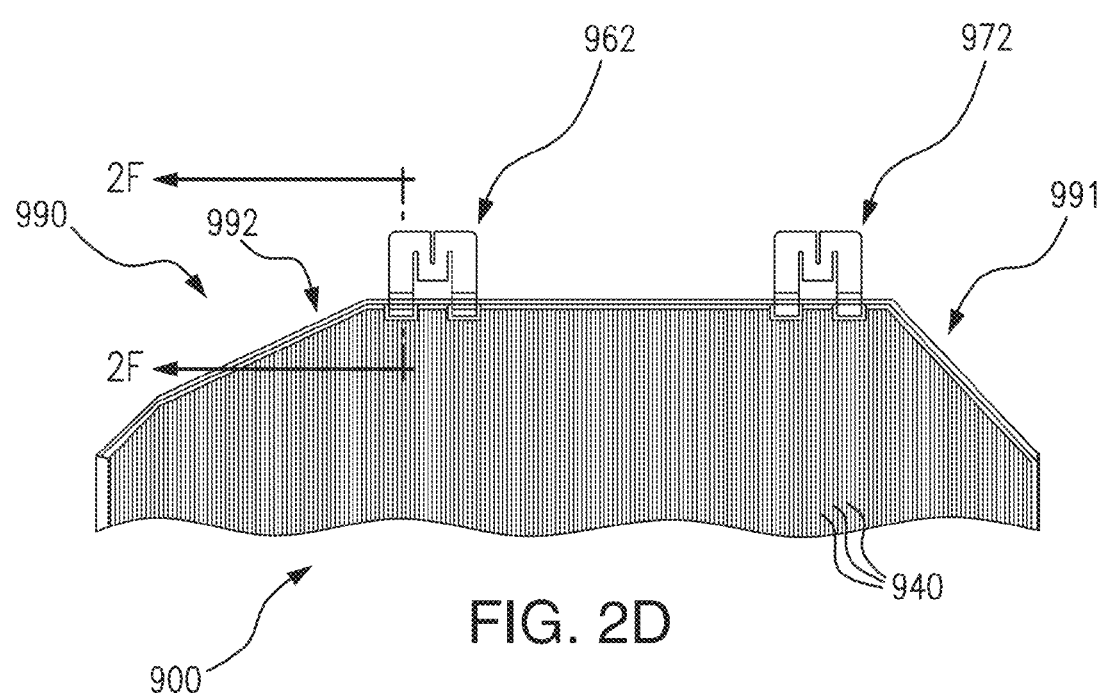
FIG. 2D is a top plan view of a portion of a solar cell with cropped corners and interconnect elements.

FIG. 2D is a top plan view of a portion of a solar cell 900 with cropped corners 991 and 992 near a peripheral edge 990 of solar cell 900. FIG. 2D also depicts interconnect elements 962 and 972, and metal grid layers 940.

Figure 2E:
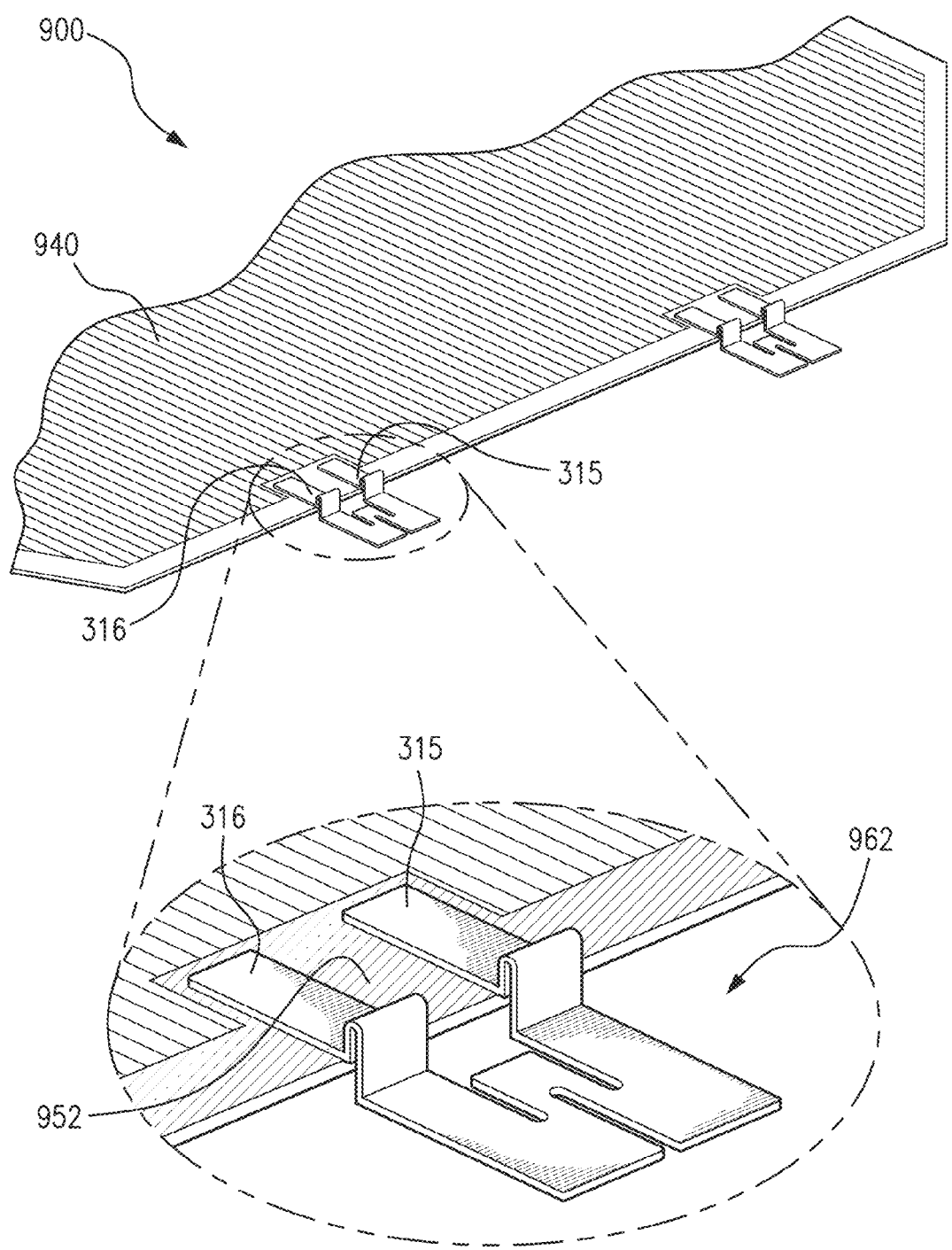
FIG. 2E is a perspective view of a portion of a solar cell with cropped corners of FIG. 2A more specifically depicting the interconnect elements.

FIG. 2E is a perspective view of a portion of a solar cell 900 with cropped corners of FIG. 2A more specifically depicting the interconnect element 962 having members 315 and 316 connected to metal contact pad 952. FIG. 2E also depicts metal grid layers 940 of solar cell 900.

Figure 2F:
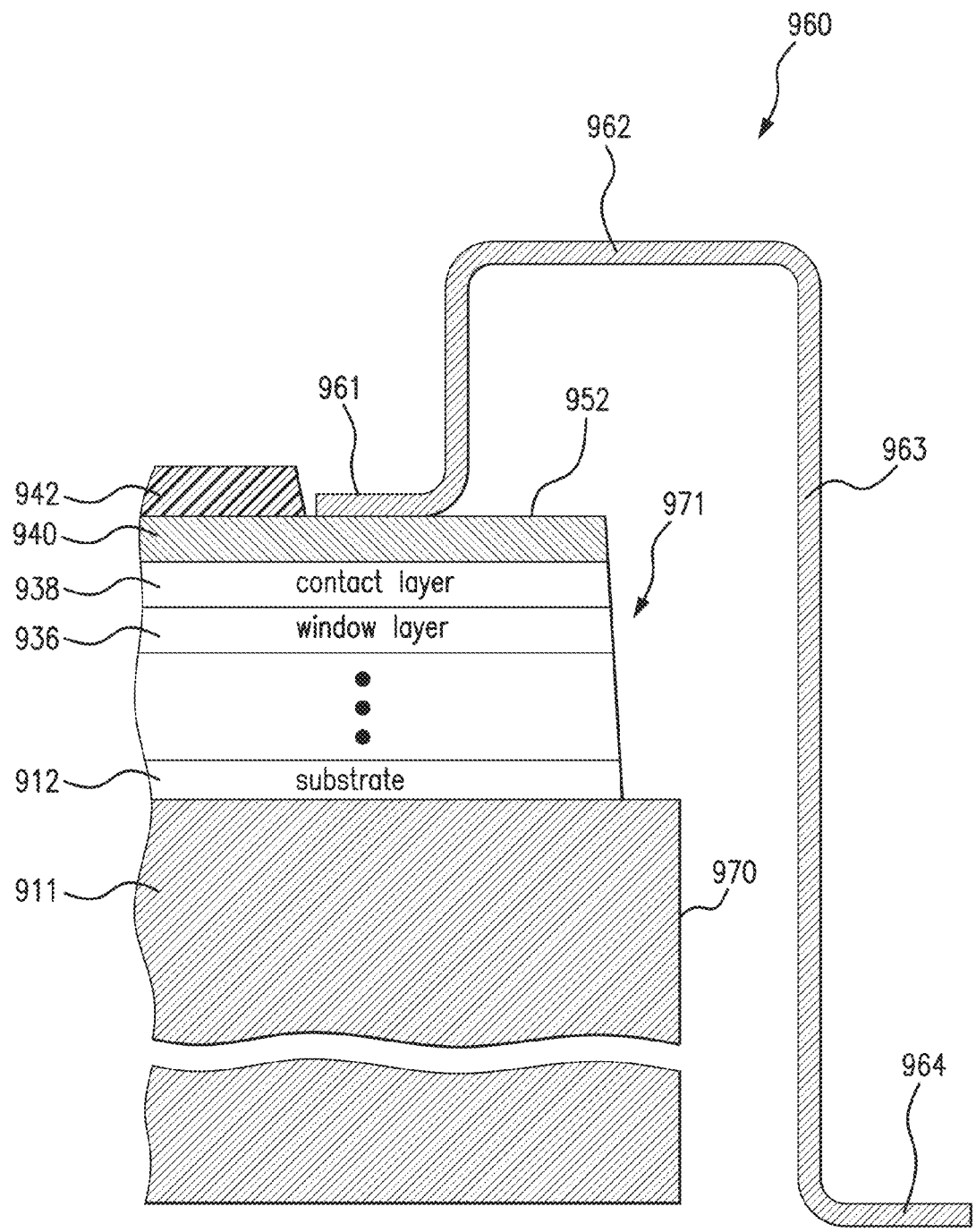
FIG. 2F is a cross-sectional view of the solar cell of FIG. 2A through the 2C-2C plane shown in FIG. 2A after connection of an interconnect element.

FIG. 2F depicts the attachment of an interconnection member 960 to the metal contact pad 952. The interconnection member 960 is a planar rectangular clip having a first flat end-portion 961 welded to the metal contact 952, a second portion 962 connected to the first end-portion 961 and extending above the surface of the solar cell, and a third portion 963 connected to the second portion 962 and being serpentine in shape, and flat second end-portion 964 extending below the bottom of the solar cell and designed and oriented so that its flat upper side surface may be welded to the bottom metal contact 911 of an adjacent solar cell 800 as shown in FIG. 2I.

Figure 2G:
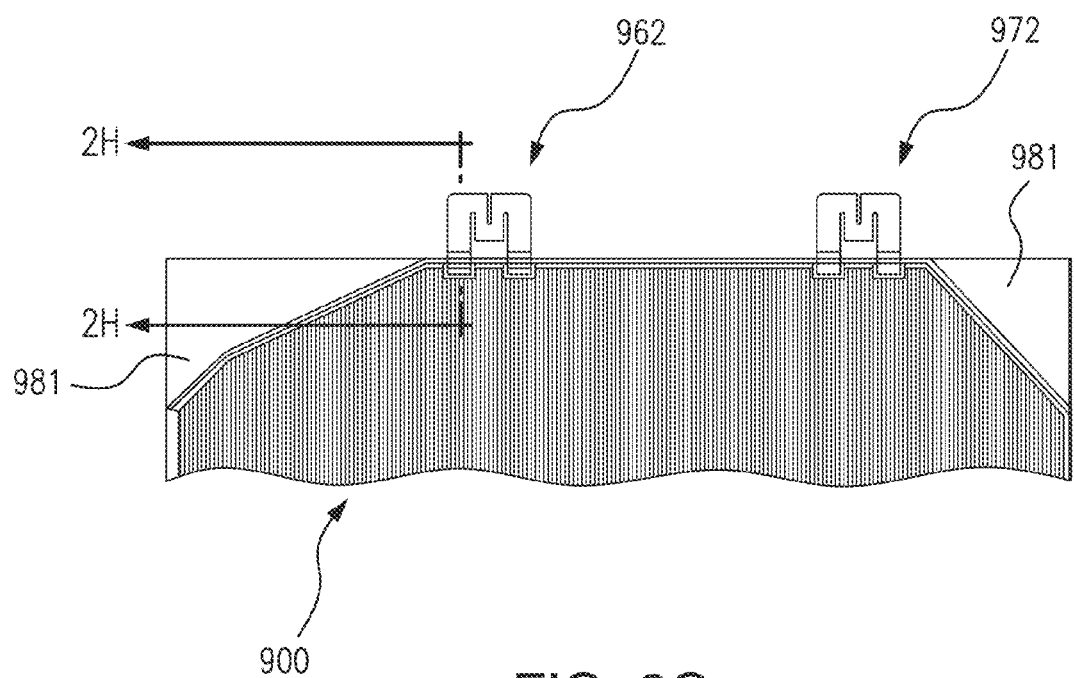
FIG. 2G is a top plan view of the solar cell of FIG. 2A after attachment of a cover glass thereby forming a Cell-Interconnect-Cover Glass (CIC)

FIG. 2G is a top plan view of the solar cell of FIG. 2A after attachment of a cover glass 981 to the top of solar cell 900, thereby forming a Cell-Interconnect-Cover Glass (CIC). FIG. 2G also depicts interconnect elements 962 and 972.

Figure 2H:
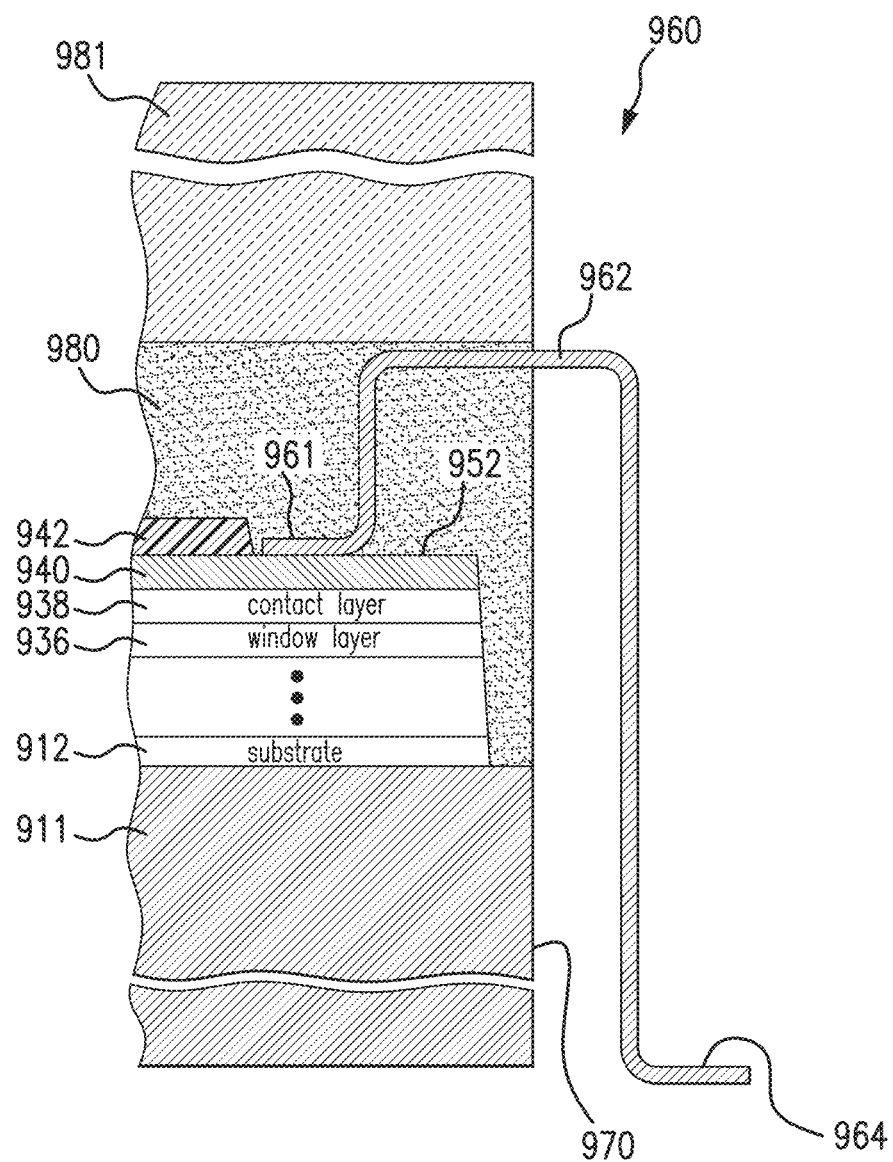
FIG. 2H is a cross-sectional view of the CIC of FIG. 2G through the 2H-2H plane shown in FIG. 2A.

FIG. 2H is a cross-sectional view of the solar cell of FIG. 2F after the next process step of attachment of a cover glass 981 to the top of the solar cell by an adhesive 980. The cover glass 981 is typically about 4 mils thick. Although the use of a cover glass is desirable for many environmental conditions and applications, it is not necessary for all implementations, and additional layers or structures may also be utilized for providing additional support or environmental protection to the solar cell.

Figure 2I:
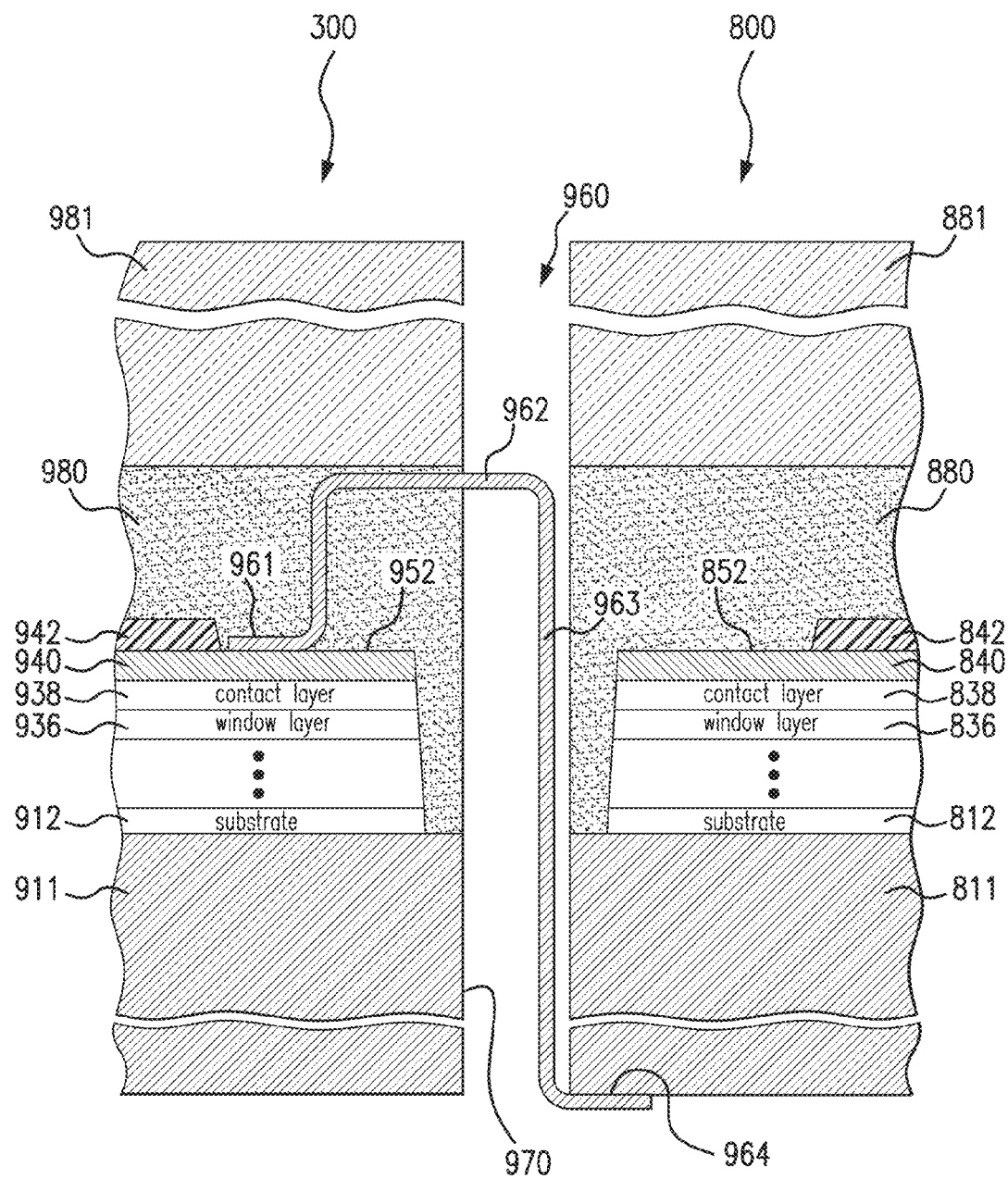
FIG. 2I is a cross-sectional view of a portion of the solar cell of FIG. 2A that has been interconnected to an adjacent solar cell using the interconnect element depicted in FIG. 2F.

FIG. 2I is a cross-sectional view of the solar cell of FIG. 2H, which is now designated as cell 300, after the next process step of alignment with the edge of an adjacent similar solar cell 800, in the process of fabricating an interconnected array or string of solar cells. The similar solar cell 800 includes layers 811, 812 through 836, 838, and 840 similar to layers 911, 912, . . . through 936, 938, and 940 respectively of solar cell 300. A cover glass 881 is attached by adhesive 880 to the solar cell 800 similar to that in solar cell 300.

Figure 3:
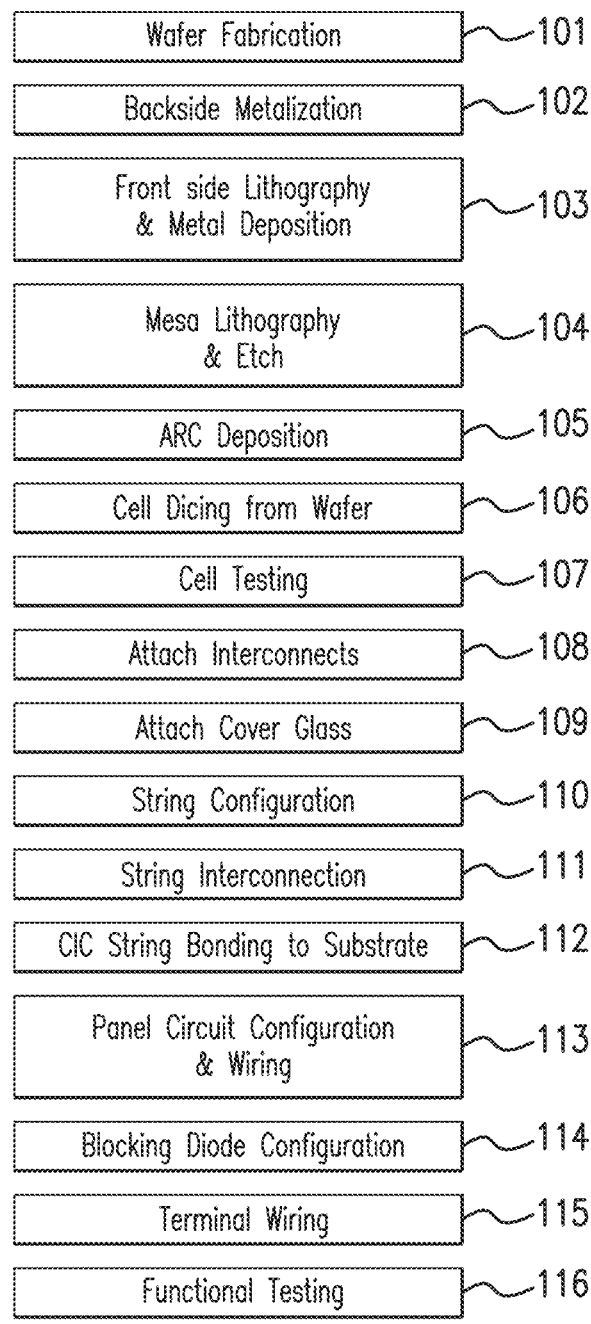
FIG. 3 is a listing of the sequence of steps in fabricating a solar cell and attaching it to a panel.

FIG. 3 is a flowchart representing a method in accordance with an embodiment of the present disclosure. Certain embodiments of the invention can include one or more of the method steps of wafer fabrication (101), backside metallization (102), front side lithography and metal deposition (103), mesa lithography and etch (104), antireflective coating (ARC) deposition (105), cell dicing from the wafer (106), cell testing (107), attaching interconnects and configuring and attaching bypass diodes (108), attaching cover glass to form CIC (109), forming string configuration (110), forming string interconnection (111), CIC string bonding to substrate (112), panel circuit configuration and wiring (113), blocking diode configuration (114), terminal wiring (115), and functional testing (116).

In certain embodiments of the present disclosure, one or more of the above-recited method steps may be performed using an automated process. Exemplary automated processes for some of the steps are further discussed herein below. However, the present disclosure is intended to include alternative automated processes that are known in the art for each method step. Further, the exemplary automated processes discussed herein to carry out one method step may be used to carry out other method steps not explicitly discussed herein. In some embodiments a plurality of recited method steps may be performed using one or more automated processes. In certain embodiments, all of the recited method steps may be performed using one or more automated processes.

In some embodiments, the automated process may use a robot (e.g., pick and place assembly tools) to perform a conventional manual process.

In some embodiments, a wire bonding laser welding machine can be used for attaching interconnects to one or more solar cells.

In some embodiments, the one or more automated processes may use machine vision. Machine vision can include imaging-based automatic inspection and analysis for applications such as automatic inspection, process control, and robot guidance. Although conventional (2D visible light) imaging is most commonly used in machine vision, alternatives include imaging various infrared bands, line scan imaging, 3D imaging of surfaces, and X-ray imaging. The most commonly used method for 3D imaging is scanning based triangulation which utilizes motion of the product or image during the imaging process. Other 3D methods used for machine vision are time of flight, grid based, and stereoscopic.

For machine vision, the imaging device (e.g. camera) can either be separate from the main image processing unit or combined with it in which case the combination can be a smart camera or a smart sensor. When separated, the connection may be made to specialized intermediate hardware such as a frame grabber using either a standardized or custom interface. Machine vision can also use digital cameras capable of direct connections (without a framegrabber) to a computer.

Although the vast majority of machine vision applications use two-dimensional imaging, machine vision applications utilizing 3D imaging are a growing alternative. One method is grid array based systems using pseudorandom structured light system. Another method of generating a 3D image is to use laser triangulation, where a laser is projected onto the surfaces of an object and the deviation of the line is used to calculate the shape. In machine vision this is accomplished with a scanning motion, either by moving the workpiece, or by moving the camera and laser imaging system. Stereoscopic vision can be used in special cases involving unique features present in both views of a pair of cameras.

Solar cell wafers can be prepared by automated methods of depositing III-V compound semiconductor layers and other layers (e.g., antireflective coating. ARC) on a substrate to fabricate a wafer. Such methods that are readily amenable to automation include, for example, metal organic chemical vapor deposition (MOCVD) methods that are readily known in the art. Backside metallization of a cell can be performed, for example, by evaporation or electrodeposition on a polyimide layer (e.g., a KAPTON® layer).

Features such as grid lines and mesas can be formed on the front sides of the wafers using conventional techniques such as lithography, metal deposition, and etching techniques, all of which are readily amenable to automation using, for example, machine vision.

Solar cell configurations particularly suitable for assembly using automated processes include those that are described in U.S. patent application Ser. Nos. 14/592,519, filed Jan. 8, 2015; Ser. No. 14/719,111, filed May 21, 2015; Ser. No. 14/729.412, filed Jun. 3, 2015; and Ser. No. 14/729,422, filed Jun. 3, 2015, all of which are incorporated herein by reference in their entireties.

One or more solar cells can be formed from a wafer using conventional techniques such as dicing or scribing. The size and shape of the solar cells can be varied as desired for particular applications as disclosed, for example, in U.S. patent application Ser. No. 14/592,519, filed Jan. 8, 2015, which is incorporated herein by reference in its entirety. Dicing or scribing of solar cells from a wafer is particularly amenable to automation using machine vision.

The functionality of the one or more solar cells can be tested by conventional automated testing equipment.

Interconnects can be attached to the one of more solar cells using, for example, automatic soldering or laser welding equipment.

In some embodiments, one end of the interconnects can have parallel gap apertures, and the interconnects can be connected, for example, by applying a parallel gap welding tool.

In some embodiments, all electrical components in the solar cell array can be continuously encapsulated with CV grade silicone, which can be used to mount multi-cell large area coverglass, or as a surface for applying advanced coatings such as Cover Glass Replacement (CGR) or radiation resistant coatings. This approach can produce an array that is electrically isolated, can mitigate high voltage arcing problems, can eliminate cracks and seams to minimize the need for expensive inter-cell grouting, and can enable electrostatic cleanliness.

Dispensing of silicone onto solar cells and coverglass has typically been performed using a patterned silk screening process or squeegee approaches. These processes require additional materials and process associated with designing and producing templates, as well as the wasteful nature of hand mixing and application. These processes are inherently wasteful and laborious, driving high cost and low process throughput. The approach described herein provides for the simple low cost and high precision application of silicone adhesive to solar cell assemblies with standardized carriers.

In some embodiments, a silicone can be dispensed on the solar cell using, for example, an automated Asymtek machine with visual recognition for maximum precision.

A cover glass can be attached to each solar cell to form a Cell-Interconnect-Cover Glass (CIC) using automated methods. For example, in some embodiments the CIC assembly process can be completed with the implementation of automated assembly and lamination. After large area or precision dispensing operations have been performed, a temporary carrier can be fixtured in a component placement machine. Using computerized visual recognition of fiducial location points, a numerically controlled component placement machine can pick the large area solar cell coverglass from a cartridge stack, placing this upon the uncured silicone dispensed in the previous step, which can then be cured to form the CIC.

In some embodiments, a similar component placement step can be implemented to both load a wire-bonding machine, as well as to perform the final submodule placement onto any suitable number of solar array substrates such as a flexible membrane or a rigid composite sandwich panel. Such automated methods can reduce or eliminate labor intensive hand operations from the entire process.

CICs can be positioned and placed on a support in an automated manner, for example, by a pick and place assembly tool to form a string configuration of CICs as described, for example, in U.S. patent application Ser. Nos. 14/719,111, filed May 21, 2015, and Ser. No. 14/729,412, filed Jun. 3, 2015, both of which are incorporated herein by reference in their entireties. Bypass and blocking diodes can be configured by similar methods.

Solar cell in a string can be interconnected using, for example, standard automation equipment for wire bonding such as an automated thermosonic wirebonding machine, and also as disclosed, for example, in U.S. patent application Ser. No. 14/719,111, filed May 21, 2015, which is incorporated herein by reference in its entirety.

String configurations or interconnected string configurations of solar cells positioned and placed on a support in an automated manner, for example, by a pick and place assembly tool as described, for example, in U.S. patent application Ser. Nos. 14/719,111, filed May 21, 2015, and Ser. No. 14/729,412, filed Jun. 3, 2015, both of which are incorporated herein by reference in their entireties. In certain embodiments, the string configurations or interconnected string configurations of solar cells can be bonded to the substrate by the automatic application of pressure and/or heat and interconnected in a similar manner as discussed herein above.

Configuring and wiring a panel circuit and terminal can be performed using conventional automated wiring equipment.

Testing the functionality of the solar cell panel can be performed by automated methods similar to those discussed herein above for testing of individual solar cells. For example, 5-cell submodules have been fabricated using the processes described herein. Testing on the submodules performed included electrical continuity, grounding, and isolation testing. The submodules were subjected them to thermal cycling from −120° C. to +120° C. to represent typical LEO orbital conditions; from −180° C. to +80° C. to represent typical GEO orbital conditions; and in a related program, to plasma environments at high voltage, as an initial qualification to Low Earth Orbit environments. All tests showed good performance and reliability for the solar cell strings before and after exposure to these environments.

An engineering economic analysis of the benefits of the automated bonding and assembly processes was performed to quantify the benefits to lowering the cost of solar cell strings sub-modular building blocks. The data in Table 1 demonstrates substantial array integration cost reduction. The results, summarized in Table 1, are on a comparative basis only and do not necessarily represent a particular absolute price for a photovoltaic array or panel in a particular quantity. Labor estimates were made based on fully burdened labor rates including a postulated overhead, but do not account for potential alternative manufacturing cell and team structures. Labor rates also do not account for the lower skill level labor that could be implemented with automated assembly equipment compared to the higher level of skill that is often required for manual fixtured or semi-automated assembly.

TABLE 1

Cost Projections for Automated vs. Traditional Approach Material & Process Cost

| Traditional Integration | | THINS Automated Integration | |
|---|---|---|---|
| Material | $/Watt | Material | $/Watt |
| Cell | 250.00 | Cell | 250.00 |
| Interconnect Foil | 20.73 | Gold Wire | 0.48 |
| Individual Coverglass | 5.12 | Large Area Coverglass | 6.11 |
| Adhesive | 3.70 | Adhesive | 1.55 |
| Diode | 12.50 | Diode | 12.50 |
| Wire | 1.00 | Terminal Strip | 12.72 |
| Consumables, Templates, Etc. | 3.00 | Flex Harness | 1.96 |
| Total Materials | 296.05 | Total Materials | 285.32 |
| Integration Process | $/Watt | Integration Process | $/Watt |
| Skilled Technician Premium | 25% | Skilled Technician Premium | 0% |
| Weld Interconnect to Cell | 6 | Pick & Place Cell, Diode, Terminal Strips | 4 |
| Weld Interconnect Cell to Cell | 6 | Automated Wire Bond Interconnect | 3 |
| Individual Silicone | 7 | Automated Encapsulation | 4 |
| Individual Cover Glass | 8 | Apply Cover Glass or CGR | 3 |
| Mask and Dispense Silicone | 12 | Automated Dispense Silicone | 3 |
| Transfer Tool | 5 | Automated Pick and Place Sub-module | 3 |
| Tiling Sheet | 5 | Vacuum Bag Press Cure | 3 |
| Laydown | 8 | Cleanup (precision dispense net process | 0 |
| Bag and Cure | 8 | | |
| Cleanup | 18 | | |
| Panel Wiring | 12 | Automated Solder Placement | 5 |
| Solder | 5 | Solder Oven Re-flow | 3 |
| Grouting | 25 | Grouting (multi-cell glass needs less) | 10 |
| Documentation and Inspection | 35 | Documentation and Inspection | 15 |
| Total Labor $/Watt | 160 | Total Labor $/Watt | 56 |
| Yield | 85.0% | Yield | 97.5% |
| Integrated Cost $/Watt | 537 | Integrated Cost $/Watt | 350 |

*costs are relative, burdened at an assumed overhead rate, and do not account for production quantities, and the potentially lower skill level needed for automated equipment operation.

Figure 4:
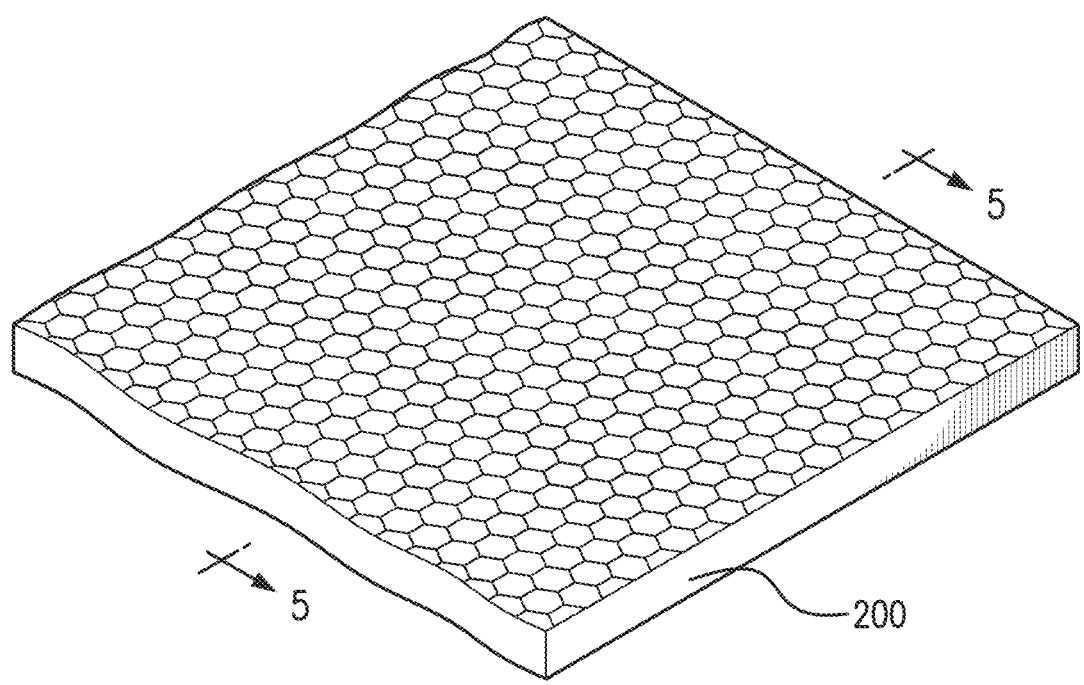
FIG. 4 is a perspective view of a honeycomb support of a panel.

FIG. 4 is a perspective view of a metallic honeycomb structure 200 which can be used for mounting a support.

Figure 5:
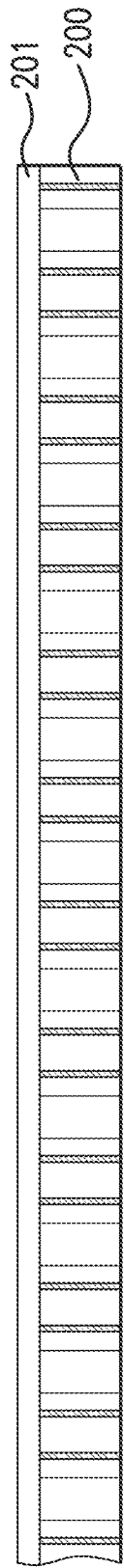
FIG. 5 is a cross-sectional view of a honeycomb panel of FIG. 4 with a carbon fiber face sheet.

FIG. 5 is a cross-sectional view of an aluminum honeycomb substrate 200 with carbon composite face sheet 201 attached thereto. In some embodiments, a double sided adhesive film can be positioned on the top surface of the face sheet, and the bottom surface of the adhesive film can be bonded to the top surface of the face sheet by, for example, co-curing. In some embodiments, a plurality of layers of carbon composite sheets can be embedded in a matrix of cyanate ester adhesive. The polyimide can then be put on top and the whole stack co-cured.

In some embodiments, a sequence of solar cell assemblies can be positioned over the top surface of the adhesive film, and each of the sequence of solar cell assemblies can be sequentially bonded to a predefined region on the top surface of the adhesive film, for example, by automatic application of pressure and/or heat. In some embodiments, the predefined region contains a pressure sensitive adhesive, and no adhesive is present on other regions of the top surface of the face sheet.

Figure 6:
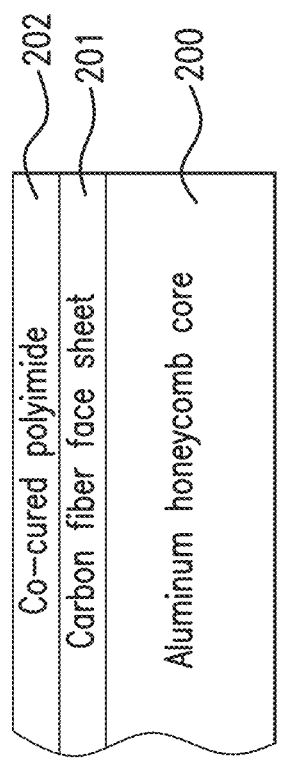
FIG. 6 is a cross-sectional view of the support assembly of FIG. 5 with a polyimide surface layer.

FIG. 6 is a cross-sectional view of an aluminum honeycomb substrate 200 with carbon composite face sheet 201 attached to aluminum honeycomb substrate 200, and co-cured polyimide substrate 202 attached to carbon composite face sheet 201.

Figure 7:
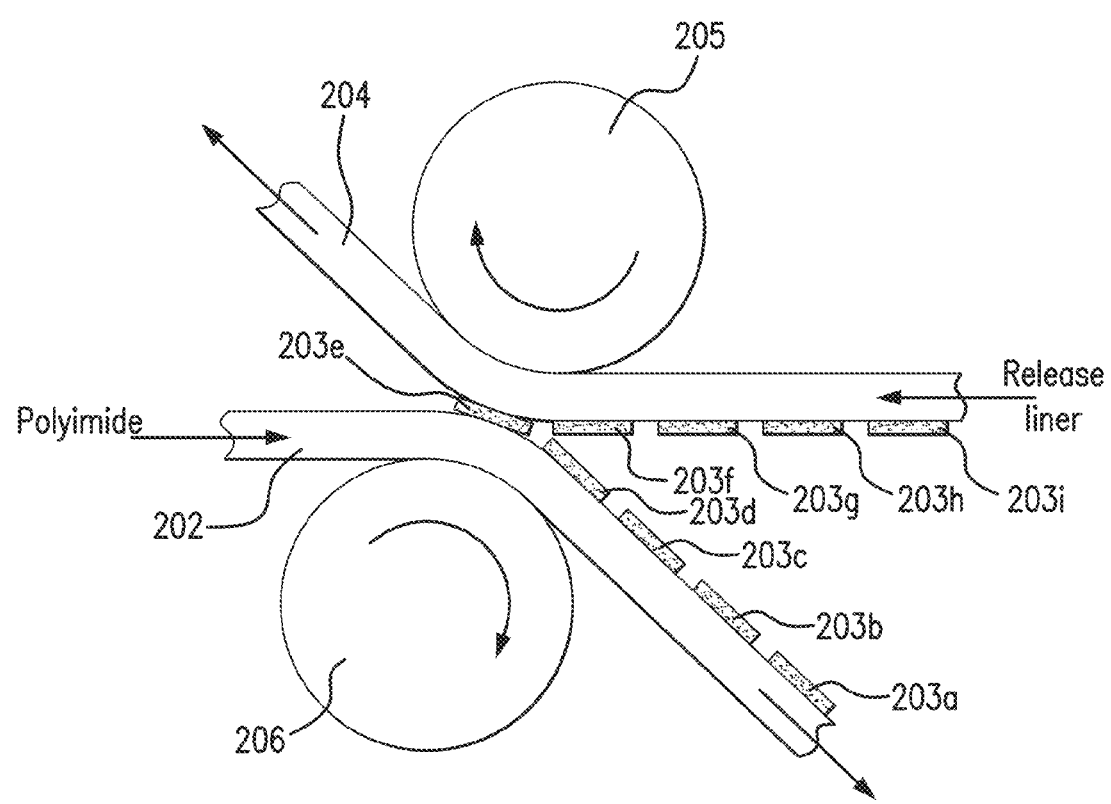
FIG. 7 is a cross sectional view of an assembly for applying the patterns of PSA patches to a polyimide sheet in an automated manner.

FIG. 7 is a cross sectional view of an assembly for applying patterns of PSA patches to a polyimide sheet in an automated manner. A sequence of PSA patches 203e, 203f, 203g, 203h, 203i, . . . are disposed on a first side of release carrier 204. The PSA patches 203e, 203f, 203g, 203h, 203i, . . . are placed in contact with a first side of polyimide sheet 202. A second side of release carrier 204 is in contact with roller 206, and a second side of polyimide sheet 202 is in contact with roller 205. Rollers 205 and 206 are rotating in the same direction (i.e., both either clockwise or counter-clockwise), which causes release carrier 204 and polyimide sheet 202 to be transported between rollers 205 and 206 in opposite directions. As release carrier 204 and polyimide sheet 202 pass through rollers 205 and 206, PSA patches 203e, 203f, 203g, 203h, 203i, . . . each come in contact with the first side of polyimide sheet 202. Rollers 205 and 206 can exert sufficient pressure on polyimide sheet 202 and release liner 204 to cause each PSA patch to be automatically transferred from the first side of release liner 204 and sequentially positioned on the first side of polyimide film 202 as shown for PSA patches 203d, 203c, 203b, and 203a.

Figure 8:
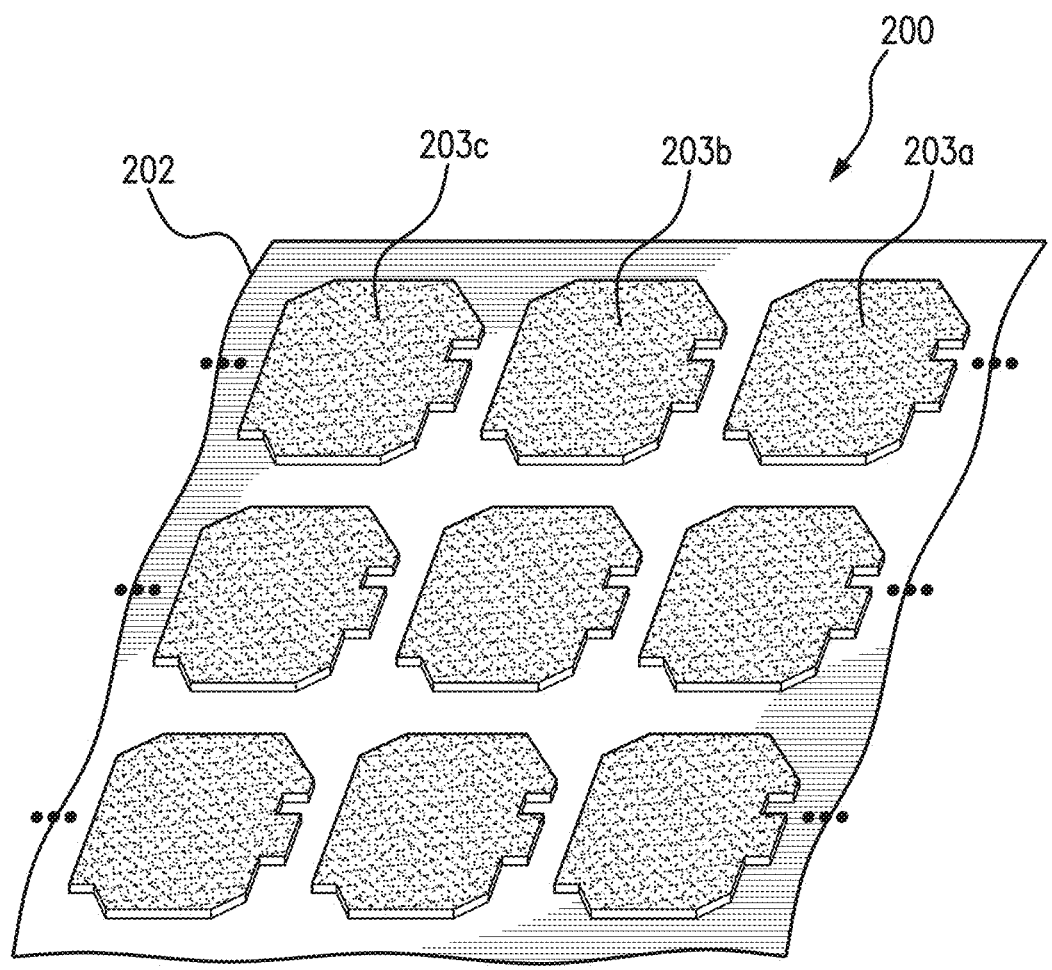
FIG. 8 is a perspective view of a pattern of PSA templates or patches on the surface of the polyimide sheet after attachment by the assembly of FIG. 7.

FIG. 8 is a perspective view of substrate 200 having a pre-selected pattern of PSA templates or patches 203a, 203b, 203c, . . . on pre-determined regions of the surface of polyimide face sheet 202 after attachment by the assembly of FIG. 7.

Figure 9:
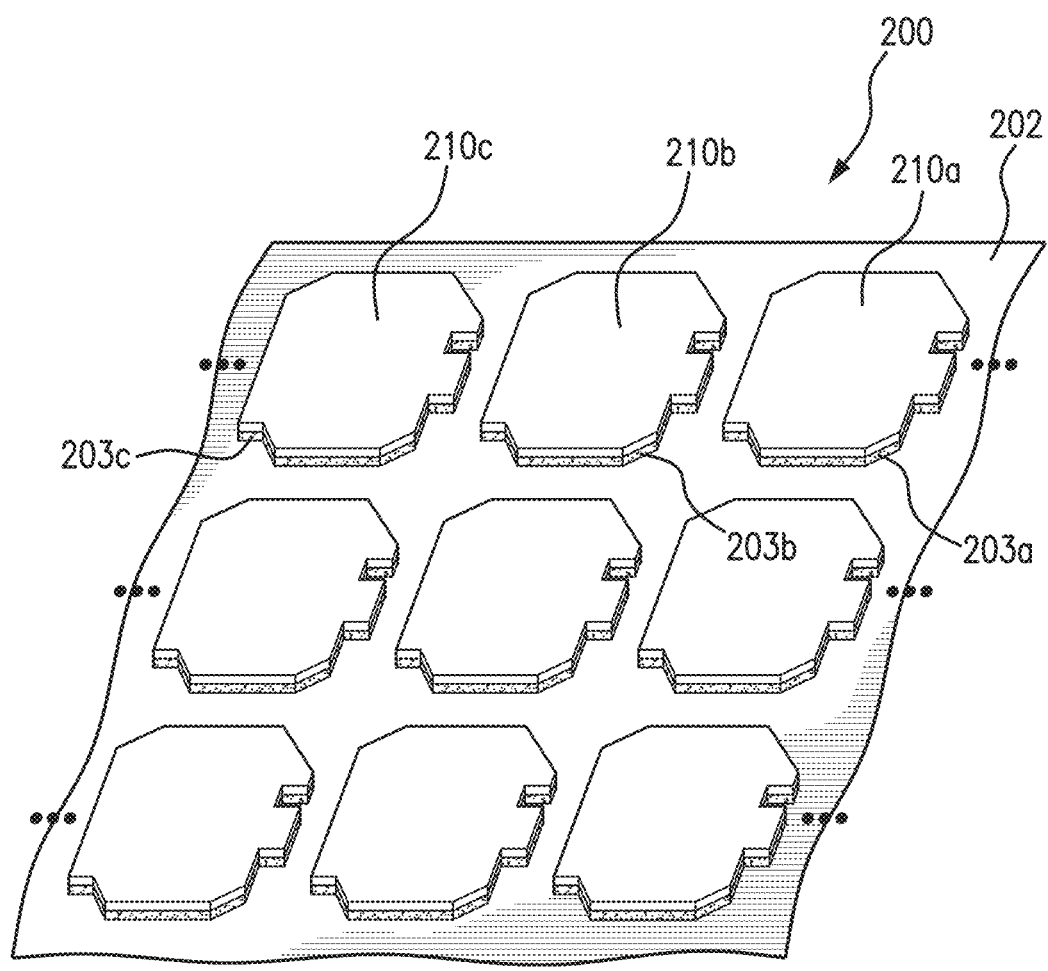
FIG. 9 is a perspective view of an array of solar cells mounted on the PSA templates or patches depicted in FIG. 8.

FIG. 9 is a perspective view of an array of solar cells 210a, 210b, 210c, . . . mounted on the PSA templates or patches 203a, 203b, 203c, . . . , respectively, as depicted in FIG. 8. The array of solar cells 210a, 210b, 210c, . . . can be mounted on the PSA templates or patches 203a, 203b, 203c, . . . , respectively, by a wide variety of methods. For example, the sequence of solar cell assemblies 210a, 210b, 210c, . . . can be disposed on a release carrier, and each solar cell assembly 210a, 210b, 210c, . . . can be detached from the release carrier as the solar cell assembly is bonded to a respective PSA template or patch 203a, 203b, 203c, . . . in a predefined region of polyimide face sheet 202 of substrate 200.

Figure 10:
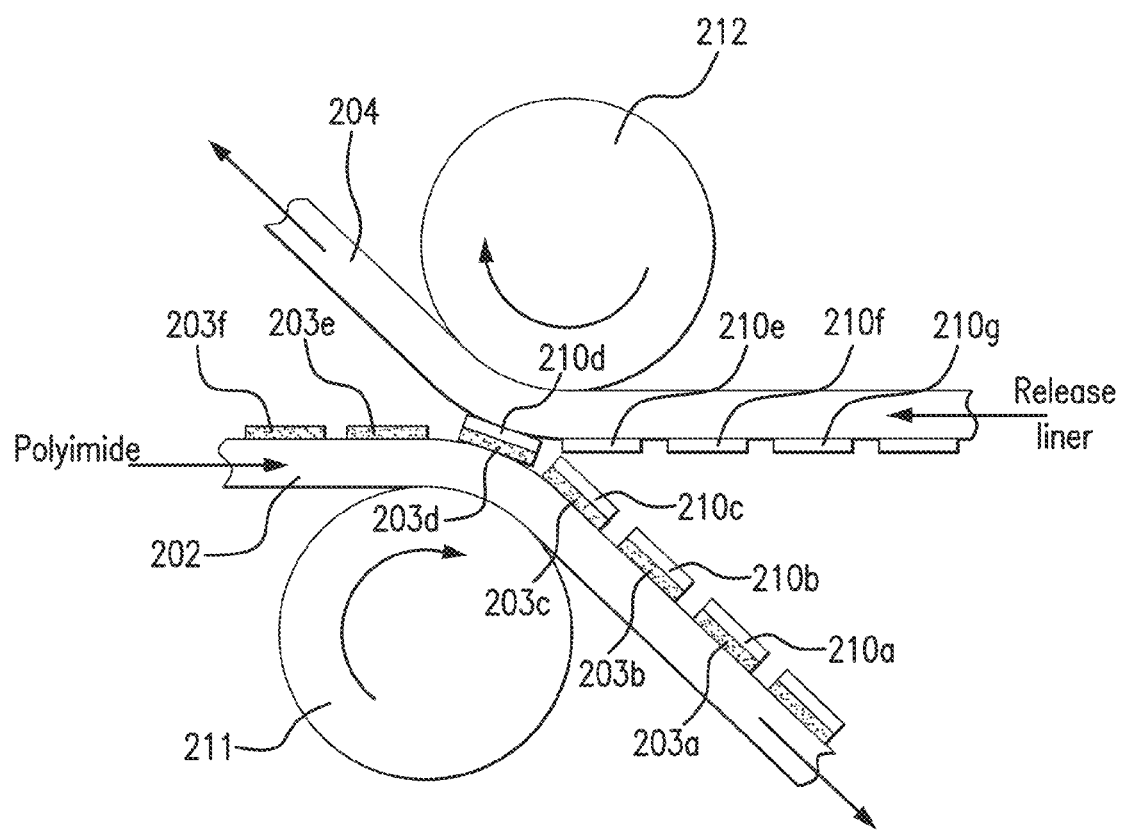
FIG. 10 is a cross sectional view of an automated assembly process for mounting the solar cells on the patterns of PSA patches attached to the polyimide sheet.

FIG. 10 is a cross sectional view of an automated assembly process for mounting the solar cell assemblies on patterns of PSA patches attached to a polyimide sheet. A sequence of solar cell assemblies 210d, 210e, 210f, 210g, . . . are disposed on a first side of release carrier 204. The PSA patches 203a, 203b, 203c, 203d, 203e, 203f, . . . disposed in predefined regions on a first side of polyimide sheet 202 are placed in contact with the sequence of solar cell assemblies 210d, 210e, 210f, 210g, . . . disposed on a first side of release carrier 204. A second side of release carrier 204 is in contact with roller 212, and a second side of polyimide sheet 202 is in contact with roller 211. Rollers 211 and 212 are rotating in the same direction (i.e., both either clockwise or counter-clockwise), which causes release carrier 204 and polyimide sheet 202 to be transported between rollers 211 and 212 in opposite directions. As release carrier 204 and polyimide sheet 202 pass through rollers 211 and 212, PSA patches 203a, 203b, 203c, 203d, 203e, 203f, . . . on polyimide sheet 202 each come in contact with solar cell assemblies 210d, 210e, 210f, 210g, . . . disposed on release carrier 204. Rollers 211 and 212 can exert sufficient pressure on polyimide sheet 202 and release liner 204 to cause each solar assembly to be automatically transferred from the first side of release liner 204 and sequentially positioned on PSA patches 203a, 203b, 203c, 203d, 203e, 203f, . . . on the first side of polyimide sheet 202 as shown for solar cell assemblies 210a, 210b, 210c, and 210d adhered to PSA patches 203a, 203b, 203c, and 203d, respectively, on pre-determined regions of the first side of polyimide sheet 202.

It is to be noted that the terms "front", "back", "top", "bottom", "over", "on", "under", and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Furthermore, those skilled in the art will recognize that boundaries between the above described operations are merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

In the claims, the word 'comprising' or 'having' does not exclude the presence of other elements or steps than those listed in a claims. The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The present disclosure can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the disclosure.

Although some specific embodiments of the present disclosure have been demonstrated in detail with examples, it should be understood by a person skilled in the art that the above examples are only intended to be illustrative but not to limit the scope of the present disclosure. It should be understood that the above embodiments can be modified without departing from the scope and spirit of the present disclosure which are to be defined by the attached claims.

The invention claimed is:

1. A method of fabricating a solar cell array carrier comprising:
providing a support for mounting an array of solar cells;
providing a pattern of a plurality of discrete predefined adhesive regions on a top surface of the support;
positioning a single solar cell assembly of a plurality of solar cell assemblies over the top surface of each adhesive region;
bonding each solar cell assembly of the plurality of solar cell assemblies to each region by application of pressure; and
electrically connecting each solar cell assembly to an adjoining solar cell assembly subsequent to the bonding step to form at least a string of electrically interconnected solar cell assemblies,
wherein electrically connecting each solar cell assembly to an adjoining solar cell assembly comprises:
automatically positioning an interconnector using a pick and place process; and
welding the placed interconnector using automatic parallel gap welding.

2. A method as defined in claim 1, wherein each predefined region contains a pressure sensitive adhesive.

3. A method as defined in claim 1, wherein each solar cell assembly is a CIC (Cover Glass-Interconnect-Solar Cell) assembly, and the solar cell in each assembly is a III-V compound semiconductor multijunction solar cell.

4. A method as defined in claim 3, wherein each multijunction solar cell includes an upper first subcell composed of indium gallium phosphide; a second solar subcell is disposed adjacent to and lattice matched to said upper first subcell, the second solar subcell including an emitter layer composed of indium gallium phosphide, and a base layer composed of indium gallium arsenide that is lattice matched to the emitter layer; and a lower subcell that is lattice matched to said second subcell and is composed of germanium.

5. A method as defined in claim 1, wherein each adhesive region is in the shape of and congruent to the shape of the bottom surface of the solar cell assembly.

6. A method as defined in claim 1, wherein each adhesive region is between 0.001 and 0.010 inches in thickness.

7. A method as defined in claim 1, wherein each solar cell assembly is between 0.010 and 0.030 inches in thickness.

8. A method as defined in claim 1, wherein the support is between 0.001 and 0.020 inches in thickness.

9. A method as defined in claim 1, wherein the bottom surface of each solar cell assembly is composed of metal.

10. A method as defined in claim 1, wherein the support is flexible and is composed of a poly (4,4'-oxydiphenylene-pyromellitimide) material.

11. A method as defined in claim 1, wherein the positioning of each solar cell assembly is performed by a pick and place assembly tool.

12. A method as defined in claim 1, wherein each solar cell assembly comprises a square-shape solar cell having a dimension in a range of 0.5 to 10 mm on a side.

13. A method as defined in claim 1, wherein adjacent solar cell assemblies bonded to each region are separated from one another by a distance of between 5 and 25 microns.

14. A method of fabricating a solar cell array carrier comprising:
providing an aluminum honeycomb support;
providing a plurality of carbon composite sheets embedded in a matrix of a cyanate ester adhesive to form a face sheet on the aluminum honeycomb support;

providing a double sided adhesive film and positioning it on a top surface of the face sheet;
bonding the bottom surface of the adhesive film to the top surface of the face sheet by co-curing;
sequentially positioning a sequence of solar cell assemblies over the top surface of the adhesive film using a pick and place assembly tool;
sequentially bonding each of the sequence of solar cell assemblies to a predefined region on the top surface of the face sheet; and
electrically connecting each solar cell assembly to an adjoining solar cell assembly subsequent to the bonding step to form at least a string of electrically interconnected solar cell assemblies,
wherein one or more method steps employ 3D imaging machine vision based on a grid array system using a pseudorandom structure light system, or based on laser triangulation to calculate a shape from a deviation of a line projected on an object.

15. A method as defined in claim 14, wherein each solar cell assembly is a CIC (Cover Glass-Interconnect-Solar Cell) assembly, and the solar cell in each assembly is a III-V compound semiconductor multijunction solar cell.

16. A method as defined in claim 14, wherein the predefined region is in the shape of and congruent to the shape of the bottom surface of the solar cell assembly.

17. A method as defined in claim 14, wherein the sequence of solar cell assemblies are disposed on a release carrier, and each solar cell assembly is detached from the release carrier as the solar cell assembly is bonded to the respective predefined region.

18. A method as defined in claim 17, wherein the release carrier is wound on a cassette spool.

19. A method of fabricating a solar cell array carrier comprising:
providing an aluminum honeycomb support;
providing a plurality of carbon composite sheets embedded in a matrix of a cyanate ester adhesive to form a face sheet on the aluminum honeycomb support;
providing a double sided adhesive film and positioning it on a the top surface of the face sheet:
bonding the bottom surface of the adhesive film to the top surface of the face sheet by co-curing;
sequentially positioning a sequence of solar cell assemblies over the top surface of the adhesive film using a pick and place assembly tool;
sequentially bonding each of the sequence of solar cell assemblies to a predefined region on the top surface of the face sheet; and
electrically connecting each solar cell assembly to an adjoining solar cell assembly subsequent to the bonding step to form at least a string of electrically interconnected solar cell assemblies, wherein electrically connecting each solar cell assembly to an adjoining solar cell assembly comprises:
automatically positioning an interconnector using a pick and place process; and
welding the placed interconnector using automatic parallel gap welding.

20. A method of fabricating a solar cell array carrier comprising:
providing a support for mounting an array of solar cells;
providing a pattern of a plurality of discrete predefined adhesive regions on a the top surface of the support;
positioning a single solar cell assembly of a plurality of solar cell assemblies over the top surface of each adhesive region;
bonding each solar cell assembly of the plurality of solar cell assemblies to each region by application of pressure; and
electrically connecting each solar cell assembly to an adjoining solar cell assembly subsequent to the bonding step to form at least a string of electrically interconnected solar cell assemblies,
wherein the method further comprises preparing each solar cell assembly of the plurality of solar cell assemblies by a method comprising:
providing a plurality of solar cells;
dispensing a silicone adhesive on each solar cell of the plurality of solar cells using an automated machine employing visual recognition;
picking a coverglass from a cartridge stack and placing the coverglass on the uncured silicone adhesive on each solar cell using a numerically controlled component placement machine using computerized visual recognition of fiducial location points; and
curing the silicone adhesive to form each CIC (Cover Glass-Interconnect-Solar Cell) assembly.

21. A method of fabricating a solar cell array carrier comprising:
providing an aluminum honeycomb support;
providing a plurality of carbon composite sheets embedded in a matrix of a cyanate ester adhesive to form a face sheet on the aluminum honeycomb support;
providing a double sided adhesive film and positioning it on a the top surface of the face sheet:
bonding the bottom surface of the adhesive film to the top surface of the face sheet by co-curing;
sequentially positioning a sequence of solar cell assemblies over the top surface of the adhesive film using a pick and place assembly tool;
sequentially bonding each of the sequence of solar cell assemblies to a predefined region on the top surface of the face sheet; and
electrically connecting each solar cell assembly to an adjoining solar cell assembly subsequent to the bonding step to form at least a string of electrically interconnected solar cell assemblies,
wherein the method further comprises preparing each solar cell assembly of the plurality of solar cell assemblies by a method comprising:
providing a plurality of solar cells;
dispensing a silicone adhesive on each solar cell of the plurality of solar cells using an automated machine employing visual recognition;
picking a coverglass from a cartridge stack and placing the coverglass on the uncured silicone adhesive on each solar cell using a numerically controlled component placement machine using computerized visual recognition of fiducial location points; and
curing the silicone adhesive to form each CIC (Cover Glass-Interconnect-Solar Cell) assembly.

22. A method of fabricating a solar cell array carrier comprising:
providing a support for mounting an array of solar cells;
providing a pattern of a plurality of discrete predefined adhesive regions on a top surface of the support;
positioning a single solar cell assembly of a plurality of solar cell assemblies over the top surface of each adhesive region;
bonding each solar cell assembly of the plurality of solar cell assemblies to each region by application of pressure; and electrically connecting each solar cell assembly to an adjoining solar cell assembly subsequent to the bonding step to form at least a string of electrically interconnected solar cell assemblies, wherein one or more method steps employ 3D imaging machine vision based on a grid array system using a pseudorandom structure light system, or based on laser triangulation to calculate a shape from a deviation of a line projected on an object.

23. A method of fabricating a solar cell array carrier comprising:

providing a flexible support composed of a poly (4,4'-oxydiphenylen-pyromellitimide) material and having a thickness of between 0.001 and 0.020 inches for mounting an array of solar cells;

providing a pattern of a plurality of discrete predefined pressure sensitive adhesive regions having a thickness of between 0.001 and 0.010 inches on the top surface of the support;

providing a plurality of square-shaped III-V compound semiconductor multijunction solar cells having a dimension in a range of 0.5 to 10 mm on a side;

dispensing a silicone adhesive on each solar cell using an automated machine employing visual recognition;

picking a coverglass from a cartridge stack and placing the coverglass on the uncured silicone adhesive on each solar cell using a numerically controlled component placement machine using computerized visual recognition of fiducial location points;

curing the silicone adhesive to form a plurality of CIC (Cover Glass-Interconnect-Solar Cell) assemblies;

positioning a single solar cell assembly of the plurality of solar cell assemblies over the top surface of each adhesive region, wherein each solar cell assembly has a thickness between 0.010 and 0.030 inches, wherein each adhesive region is in the shape of and congruent to the shape of the bottom surface of the solar cell assembly, and wherein each solar cell assembly is a CIC (Cover Glass-Interconnect-Solar Cell) assembly having a bottom surface composed of metal;

bonding each solar cell assembly of the plurality of solar cell assemblies to each region by application of pressure, wherein adjacent solar cell assemblies bonded to each region are separated from one another by a distance of between 5 and 25 microns;

automatically positioning an interconnector using a pick and place process subsequent to the bonding step; and welding the placed interconnector using automatic parallel gap welding to electrically connect each solar cell assembly to an adjoining solar cell assembly to form at least a string of electrically interconnected solar cell assemblies, wherein each multijunction solar cell includes an upper first subcell composed of indium gallium phosphide; a second solar subcell is disposed adjacent to and lattice matched to said upper first subcell, the second solar subcell including an emitter layer composed of indium gallium phosphide, and a base layer composed of indium gallium arsenide that is lattice matched to the emitter layer; and a lower subcell that is lattice matched to said second subcell and is composed of germanium.

* * * * *